United States Patent [19]

Martineau

[11] Patent Number: 5,369,794
[45] Date of Patent: Nov. 29, 1994

[54] ADAPTIVE OSCILLATOR FREQUENCY FEEDTHROUGH CANCELLATION IN MIXER CIRCUIT

[75] Inventor: Didier Martineau, Andresy, France

[73] Assignee: Thomson-LGT Laboratoire General des Telecommunications, Conflans Sainte Honorine, France

[21] Appl. No.: 995,976

[22] Filed: Dec. 23, 1992

[30] Foreign Application Priority Data

Dec. 23, 1991 [FR] France ............... 91 16041

[51] Int. Cl.$^5$ .......................................... H04B 1/10
[52] U.S. Cl. ................................. 455/317; 455/304; 455/306; 455/310
[58] Field of Search ............... 455/295, 296, 302, 303, 455/304, 305, 306, 307, 310, 311, 316, 317

[56] References Cited

U.S. PATENT DOCUMENTS

| | | | |
|---|---|---|---|
| 4,355,420 | 10/1982 | Ishihara | 455/317 |
| 4,373,209 | 2/1983 | Kaneda | 455/295 |
| 5,033,110 | 7/1991 | Harman | 455/317 |
| 5,086,512 | 2/1992 | Bartz | 455/317 |
| 5,161,254 | 11/1992 | Braathen | 455/310 |

FOREIGN PATENT DOCUMENTS 0324897 7/1989 European Pat. Off.
0347761 12/1989 European Pat. Off.
0025432 2/1984 Japan ........................ 455/317

OTHER PUBLICATIONS

16th European Microwave Conference, Dublin, Sep. 8–12, 1986, pp. 157–163, W. Schiller, et al., "High Linearity Upconverter With Ultra Low Distortion Over A Broad Frequency ...".

Primary Examiner—Reinhard J. Eisenzopf
Assistant Examiner—Mark D. Wisler
Attorney, Agent, or Firm—Oblon, Spivak, McClelland, Maier & Neustadt

[57] ABSTRACT

The disclosure relates to the changing of frequencies. The mixing of a signal at a frequency Fe and of the signal of a local oscillator gives a resultant signal that comprises a first component at the useful frequency, a second component at the frequency of the oscillator and a third component which is an image of the first component with respect to the second one. A filtering highly attenuates the third component. A servo-control makes a part of the signal from the oscillator undergo variations in amplitude and phase before adding it to the resultant signal to be filtered; the variations are made so as to obtain a minimum energy from the second component before filtering. Application to the changing of frequencies with suppression of the component at the frequency of the local oscillator.

8 Claims, 1 Drawing Sheet

ADAPTIVE OSCILLATOR FREQUENCY FEEDTHROUGH CANCELLATION IN MIXER CIRCUIT

BACKGROUND OF THE INVENTION

The present invention relates to the changing of frequencies with suppression of the component at the frequency of the local oscillator that has enabled the changing.

Frequency changing is achieved by mixing between an input signal at a frequency that is generally called an intermediate frequency and a signal called a local frequency signal given by a local oscillator. This changing gives a first component which is the useful signal, a second component at the local frequency and a third component which is an image of the first component with respect to the second component. The word "image" herein implies that the differences between the local frequency and the frequencies of the first and third components have the same value in absolute terms but have opposite signs.

Given that the first component which is the useful component has to be obtained alone, there are known ways of greatly attenuating the other two components by means of a filter placed at the output of the mixer that has carried out the changing. This filter is a passband filter centered on the frequency of the useful signal which shall be called a useful frequency. This filter attenuates the signals at the local frequency and at the frequency of the image component which shall be called the image frequency. The suppression of the local frequency is the result that is the most difficult to obtain for, of the two frequencies to be suppressed, it is this frequency that is the closest to the useful frequency.

SUMMARY OF THE INVENTION

The aim of the present invention is to set up a system to automatically suppress the frequency of the local oscillator after a changing of frequency so that the output passband filter of the frequency-changing device no longer has to filter anything other than the image component.

This is obtained by servo-control through the preparation, from the output signal of the passband filter, a signal that has substantially the same amplitude as the second component of the output signal of the mixer that is in phase opposition with this second component. This is obtained by the addition of the signal thus prepared to the signal coming from the mixer and reaching the passband filter.

According to the present invention, there is provided a method for the changing of a frequency that shall be called an intermediate frequency by means of a frequency that shall be called a local frequency to obtain a useful frequency, said method comprising in mixing intermediate frequency signals and local frequency signals to give a resultant signal comprising a first component at a useful frequency, a second component at the local frequency and a third component which is an image of the first component with respect to the second component, and in carrying out a passband filtering of the resultant signal, in adding, before the filtering, a correction signal corresponding to the second component phase-shifted by 180° and, to this end, in picking up a part of the signal after filtering, in creating by intermodulation of the picked-up part, from the signal after filtering, an auxiliary component at the local frequency, in picking up a part of the signal at the local frequency and, as a function of the value of the auxiliary component, in amplifying and phase-shifting the picked-up part of the local frequency signal to make the correction signal therefrom.

According to the present invention, there is further provided a device for the changing of a first signal at a frequency that shall be called an intermediate frequency by a second signal at a frequency that shall be called a local frequency to obtain a signal at a frequency that shall be called a useful frequency, a local oscillator to give the second signal, a mixer circuit to mix the first and second signals and give a resultant signal comprising a first component at the useful frequency, a second component at the local frequency and a third component which is an image of the first component with respect to the second component, an output filter to receive the resultant signal and extract the first component therefrom, said filter having an output, first means coupled to the output of the output filter to create, by intermodulation, an auxiliary component at the local frequency, second means to give a measurement of the value of the power of the auxiliary component and third means to pick up a part of the second signal and attenuate it and phase-shift it before adding it to the resultant signal, the attenuation and the phase-shift being adjusted so as to make the measured value the minimum value.

BRIEF DESCRIPTION OF THE DRAWING

The present invention shall be understood more clearly and other characteristics shall appear from the following description and from the figures relating thereto, of which.

In the figures, the corresponding elements are designated by the same references.

MORE DETAILED DESCRIPTION

Figure 1:
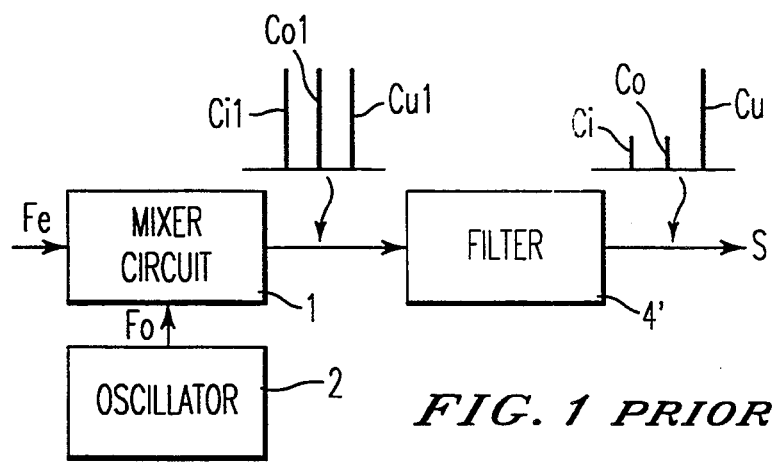
FIG. 1 shows a frequency-changing device according to the prior art.

FIG. 1 gives a schematic view of a frequency-changing device such as is made in a known way. The role of this device is to change an input signal at a frequency $Fe$, generally called an intermediate frequency, into a signal at a frequency $Fo+Fe$ or $Fo-Fe$ by means of a signal at a fixed frequency $Fo$, called a local frequency. The device comprises a mixer circuit which receives, at a first input, the signal at a frequency $Fe$ and, at a second input, the signal at a fixed frequency $Fo$ delivered by a local oscillator 2. At its output, the mixer circuit 1 delivers a signal comprising three components: a first component $Cu1$ which shall also be called a useful component, a second component $C01$ which shall also be called a local component and a third component $Ci1$ which shall also be called an image component; the local component is at the frequency $Fo$ of the local oscillator while the image component and the useful component are at the frequencies $Fo+Fe$ and $Fo-Fe$ and, in the examples according to FIGS. 1 and 2, it is assumed that the useful component is at the frequency $Fo+Fe$ and the image component is at the frequency $Fo-Fe$.

The output signal of the mixer circuit 1 is applied to the input of a passband filter 4' which has the role of greatly attenuating the second and third components C01, Ci1. The filter 4', therefore, at its output which constitutes the output S of the device, gives a signal which again comprises the three components but, among these three components which are now called Cu, Co and Ci, the useful component Cu has an amplitude very substantially greater than that of the other two components.

Figure 2:
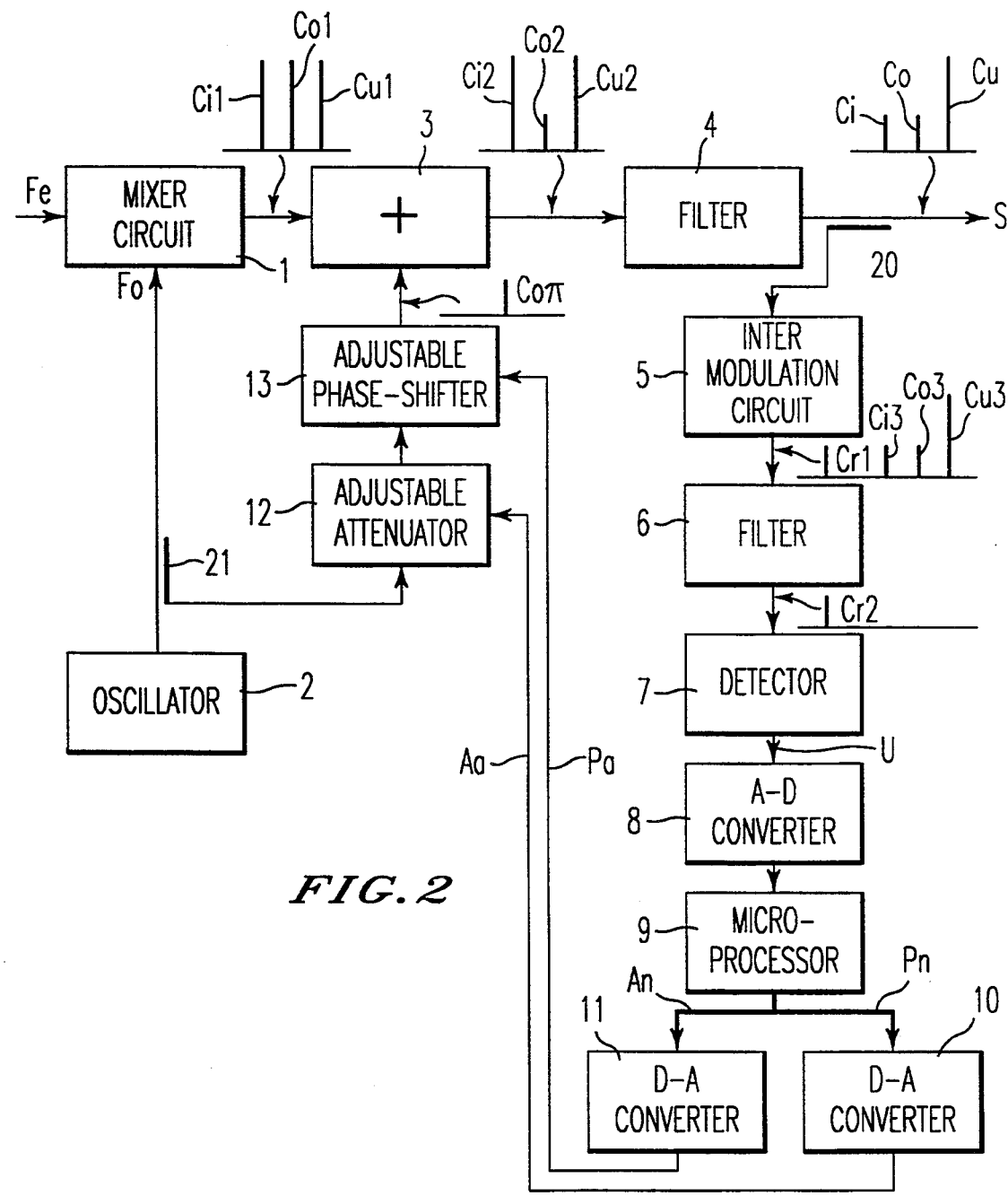
FIG. 2 shows a frequency-changing device according to the invention.

In FIG. 1, as also in FIG. 2, the components of certain of the signals have been shown in the form of lines of a spectrum of lines.

The filter 4' of the device according to FIG. 1 is complicated and hence difficult to make given that it should attenuate the second component C01 of its input signal without attenuating its first component Cu1 and that these two components are at fairly close frequencies.

The diagram according to FIG. 2 shows how the output filtering of a frequency-changing device can be simplified by a prior reduction of the local component which means that the output filter of the device no longer has to filter anything else but the image component, for which the difference in frequency with the useful component is twice as great as the difference between the useful and local components.

In the diagram of FIG. 2, the three components, namely the useful, local and image components, are also present and, at different places, they are shown in the form of spectra of lines. In order to distinguish them as a function of the processing operations undergone by the signal that includes them, these three components, as well as others that shall be described here below, are followed by a figure or by the letter $\pi$ except at the output of the frequency-changing device where the useful, local and image components are simply referenced Cu, Co, Ci.

FIG. 2 shows a mixer circuit 1 which receives an intermediate frequency signal Fe at a first input and the fixed frequency signal Fo, delivered by a local oscillator 2, at a second input. The output signal of the circuit 1 is applied to the first input of an adder circuit 3, the output of which is connected to the input of a passband filter 4. The output of the filter 4 is connected to the output S of the device by an energy coupling circuit 20 which picks up a very small part of the output energy from the filter 4 to apply it to the input of an intermodulation circuit 5.

The intermodulation circuit 5 is followed, in series, by a passband filter 6, a detector 7, an analog-digital converter 8 and a microprocessor 9. The microprocessor 9 gives two signals An and Pn which are respectively applied to two digital-analog converters 10, 11.

The output signals Aa and Pa of the converters 10, 11 respectively serve as control signals for an adjustable attenuator 12 and an adjustable phase-shifter 13. A coupling circuit 21 picks up a part of the energy at the frequency Fo delivered by the local oscillator 2, and gives it to the attenuator 12. The output of the attenuator 12 is connected to the signal input of the phase-shifter 13, the output of which is connected to the second input of the adder circuit 3.

The part of the energy of the local oscillator 2, picked up by the coupling circuit 21, is attenuated in the adjustable attenuator 12 and phase-shifted in the adjustable phase-shifter 13 to give, at the second input of the adder circuit 3, a signal Co$\pi$, constituted by a single component at the frequency Fo. This signal is added to the signal having components Cu1, Co1, Ci1 coming out of the mixer circuit 1.

The control signal Aa for the attenuator 12 and the control signal Pa for the phase-shifter 13 are such that they enable the phase and the amplitude of the signal Co$\pi$ to be adjusted so that the last signal has substantially the same amplitude as the local component Co1 at the output of the circuit 1 but phase-shifted by 180° with respect to this component.

Thus, by summation, Co1 and Co$\pi$ tend to cancel each other out. Co2 represents the residue of local component at the output of the adder circuit 3. The power of the component Co2 depends on the precision of the adjustment of the attenuator 12 and of the phase-shifter 13.

The output signal of the adder circuit 3 comprises the useful component Cu2, the highly attenuated local component Co2 and the image component Ci2. This signal is filtered by the passband 4 which is centered on the frequency of the useful component and, among the three components, attenuates only the image component. The components of the output signal of the filter 4 are referenced Cu, Co and Ci.

The part of the energy picked up by the coupling circuit 20 at the output of the filter 4 is amplified in the intermodulation circuit 5. In the example described, the circuit 5 is constituted by an amplifier working at its saturation level. The circuit 5 generates a signal with the useful component Cu3, local component Co3 and image component Ci3 as well as intermodulation products, one of which is especially valuable since it is located at the frequency of the intermediate frequency Fe signal and since its power is proportional to the power of the local component Co at the output of the filter 4; the component relating to this intermodulation product is referenced Cr1.

The passband filter 6 is centered on the frequency Fe so as to deliver, at its output, a signal comprising solely a component Cr2 at the frequency Fe. The detector 7 which receives the component Cr2 signal therefore gives a voltage U, proportional to the power of the component Co at the output of the filter 4. This voltage U is converted into digital form by the analog-digital converter 8 to be delivered to the microprocessor 9.

The microprocessor 9 generates the signals An and Pn which, after digital-to-analog conversion, give respectively the attenuator 12 control signal Aa and the phase-shifter 13 control signal Pa.

The program for the preparation by the microprocessor 9 of the signals An and Pn as a function of the voltage U converted into digital form can be divided into two parts.

During the first part, when the power is turned on in the device, the program generates all the possible combinations between An and Pn. For each pair An-Pn sent to the converters 11 and 12 and hence to the adjustable attenuator 12 and the adjustable phase-shifter 13, the converter 8 gives the microprocessor 9 the digital value of the voltage U relative to the pair considered.

One of these pairs corresponds to a minimum voltage U: the two signals which form this pair for which U is the minimum are sent permanently, respectively to the converters 10 and 11 to control the attenuator 12 and the phase-shifter 13. And this setting of U at its minimum value ensures that the power of the local component Co at the output of the filter 4 is reduced to its minimum value.

During the second part, the variations in power of the image component at the output of the filter 4 have to be corrected as soon as they appear. Such variations may result from variations in temperature or from an ageing of the equipment. To make this correction, the program includes a permanent measurement of the voltage U. If U moves away from its minimum value, the program makes the pair An-Pn vary about previously obtained values An and Pn and, for each new pair, measures the value of U: when a new minimum voltage U is found, the microprocessor 9 permanently sends the new pair corresponding to this new minimum voltage. Thus, the device is permanent looped.

The frequency-changing device used as an example for the the description according to FIG. 2 worked with a frequency Fe of 15 MHz and a local frequency capable of assuming values ranging from 350 to 700 MHz. The converter 8 was an 8-bit converter and the converters 10, 11 were 14-bit converters. The suppression of the local component Co at the output of the filter 4, measured in relation to the level of the useful component Cu at the output of this same filter, is 50 dB throughout the band of working frequencies.

The present invention is not limited to the example described. It is thus, in particular, that the first part of the program may consist in the memorizing, for the different values of frequencies that may be assumed by the input signals of the mixer circuit, of the pairs of signals An-Pn, giving a minimum value U. When the power is turned on in the device, the second part of the program will be immediately started from the memorized pair which which corresponds to the frequencies Fe and Fo.

Very generally, the field of the invention is constituted by all the frequency changings where, before the output filtering, the local component is greatly attenuated by the addition, to the output signal of the mixer circuit, of a signal which, with respect to the local component of this output signal, has the same amplitude but is phase-shifted by 180 degrees.

What is claimed is:

1. A method for changing a frequency of an input signal that shall be called an intermediate frequency signal by using a local frequency signal to obtain a useful frequency signal, said method comprising the steps of:
   mixing intermediate frequency signals and local frequency signals to give a resultant signal comprising a first component at the useful frequency a second component at the local frequency and a third component which is an image of the first component with respect to the second component;
   passband filtering the resultant signal;
   adding, before the passband filtering step, a correction signal corresponding to the second component phase-shifted by 180°;
   intermodulating from a signal resulting from the bandpass filtering, an auxiliary component at the intermediate frequency; and
   amplifying and phase-shifting, as a function of a value of the auxiliary component, the local frequency signal to generate the correction signal therefrom.

2. A device for changing a first signal at a frequency that shall be called an intermediate frequency by a second signal at a local frequency to obtain a signal at a useful frequency, comprising:
   a local oscillator for generating the second signal;
   a mixer circuit to mix the first and second signals and give a resultant signal comprising a first component at the useful frequency, a second component at the local frequency and a third component which is an image of the first component with respect to the second component;
   an output filter which receives the resultant signal and extracts the first component therefrom, said output filter having an output;
   first means coupled to the output of the output filter for intermodulating, an auxiliary component at the intermediate frequency;
   second means for measuring a value of the power of the auxiliary component; and
   third means, responsive to said second means, for attenuating and phase-shifting the second signal and adding a result thereof to the resultant signal, the attenuating and the phase-shifting being adjusted so as to make the power of the auxiliary component a minimum value.

3. A device according to claim 2, wherein the first means comprises, in series, an energy coupling circuit coupled to the output of the output filter, an amplifier working at a saturation level thereof, and a passband filter centered on the intermediate frequency.

4. A device according to claim 2, wherein the second means comprise a detection circuit.

5. A device according to claim 2, wherein the third means comprise a microprocessor to receive the measured value and activate the attenuation and the phase-shifting of the third means.

6. A method according to claim 1, wherein said intermodulating step intermodulates the signal resulting from the passband filtering and produces a signal which contains said auxiliary component, said auxiliary component being having a power which is proportional to a power of the second component of said resultant signal.

7. A method according to claim 1, wherein said step of amplifying and phase-shifting comprises the steps of:
   generating an amplification control signal which controls an amount of said amplification;
   generating a phase-shifting control signal which controls an amount of said phase shifting;
   wherein upon a start-up condition, generating said amplification control signal and said phase-shifting control signal in a plurality of combinations of said amplification control signal and said phase shifting control signal are generated.

8. A method according to claim 1, further comprising the step of:
   determining, during said start-up condition, a combination of said amplification control signal and said phase-shifting control signal which results in the second component of the resultant signal having a lowest power;
   wherein after said start-up condition, said determined combination which results in the second component of the resultant signal having the lowest power are used to control said amplification and said phase-shifting.

* * * * *